(12) United States Patent
Bryant et al.

(10) Patent No.: US 6,429,056 B1
(45) Date of Patent: Aug. 6, 2002

(54) DYNAMIC THRESHOLD VOLTAGE DEVICES WITH LOW GATE TO SUBSTRATE RESISTANCE

(75) Inventors: Andres A. Bryant; Edward Joseph Nowak, both of Essex Junction; Minh Ho Tong, Essex, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/447,122

(22) Filed: Nov. 22, 1999

(51) Int. Cl.[7] ............................................... H01L 21/84
(52) U.S. Cl. .................... 438/151; 438/301; 438/585
(58) Field of Search .................................. 438/301, 592, 438/585, 151

(56) References Cited

U.S. PATENT DOCUMENTS

| | | | |
|---|---|---|---|
| 5,320,975 A | | 6/1994 | Cederbaum et al. |
| 5,393,681 A | * | 2/1995 | Witek ........................ 438/301 |
| 5,405,795 A | * | 4/1995 | Beyer ........................ 438/151 |
| 5,571,738 A | | 11/1996 | Krivokapic |
| 5,668,051 A | | 9/1997 | Chen et al. |
| 5,670,426 A | | 9/1997 | Kuo et al. |
| 5,677,557 A | | 10/1997 | Wuu et al. |
| 5,710,073 A | | 1/1998 | Jeng et al. |
| 5,733,812 A | | 3/1998 | Ueda et al. |
| 5,834,846 A | | 11/1998 | Shinriki et al. |
| 5,869,867 A | | 2/1999 | Takeuchi |
| 5,994,177 A | * | 11/1999 | Wong ......................... 438/202 |
| 5,998,847 A | * | 12/1999 | Assaderaghi ................ 257/401 |
| 6,093,610 A | * | 7/2000 | Rodder ....................... 438/289 |
| 6,096,611 A | * | 8/2000 | Wu ............................. 438/289 |
| 6,136,655 A | * | 10/2000 | Assaderaghi ................ 438/289 |
| 6,159,807 A | * | 12/2000 | Bryant ....................... 438/289 |

\* cited by examiner

*Primary Examiner*—John F. Niebling
*Assistant Examiner*—Stacy A Whitmore
(74) *Attorney, Agent, or Firm*—Schmeiser, Olsen & Watts; Mark F. Chadurjian

(57) ABSTRACT

Described is a dynamic threshold field effect transistor (DTFET) that includes a gate-to-body contact structure within the gate. By forming the gate-to-body contact structure that can reduce the gate-to-body contact resistance and increase the device packing density, the DTFET can be used in silicon on insulator (SOI) technologies and take full advantages of the DT-CMOS performance benefit.

6 Claims, 15 Drawing Sheets

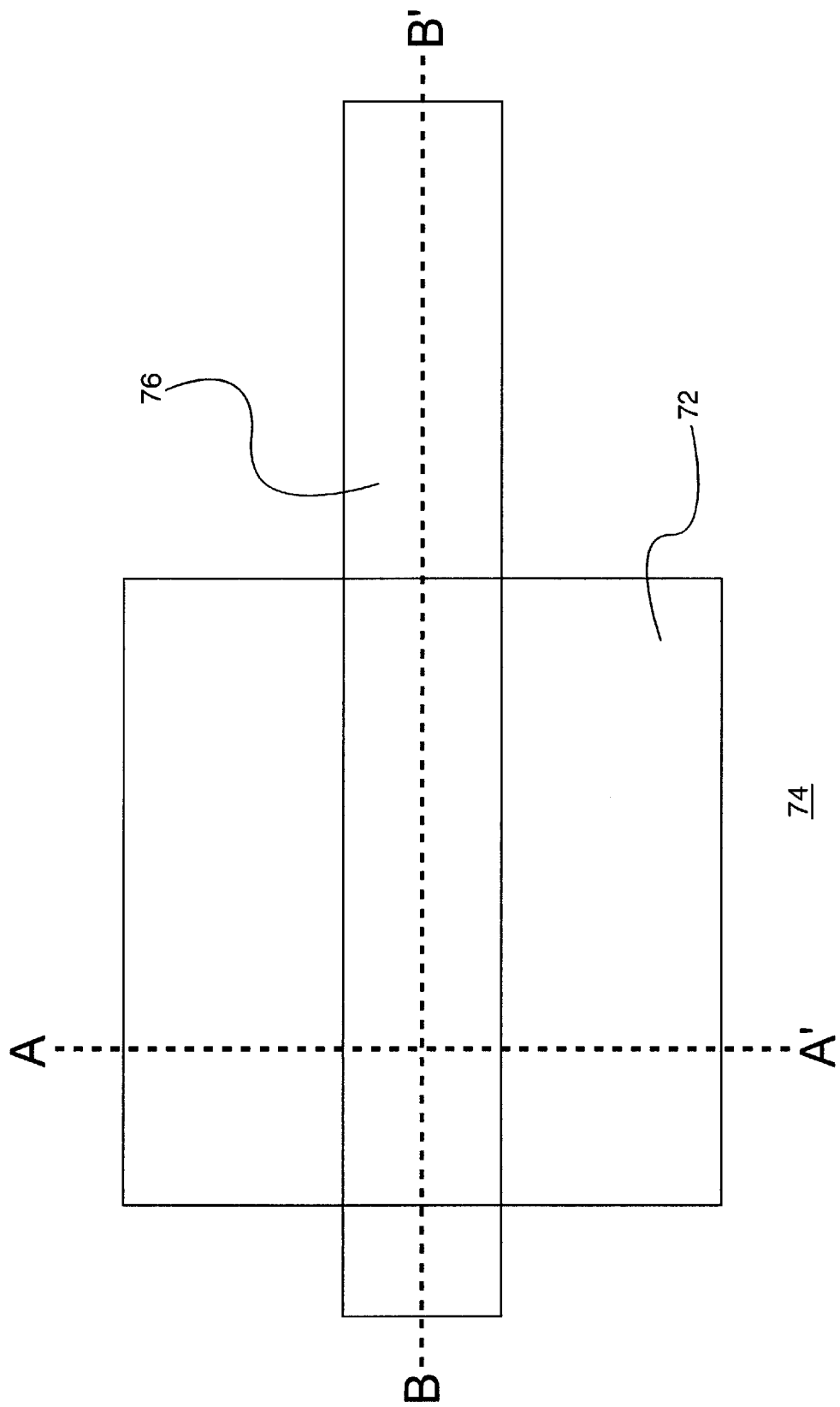

DYNAMIC THRESHOLD VOLTAGE DEVICES WITH LOW GATE TO SUBSTRATE RESISTANCE

FIELD OF THE INVENTION

The present invention relates to a semiconductor apparatus including a dynamic threshold field effect transistor (DTFET), and to a method of producing the same. More particularly, the present invention relates to a method of lowering the resistance of gate interconnections and concurrently making a high device packing density possible on semiconductor substrates.

BACKGROUND OF THE INVENTION

Metal oxide semiconductor field effect transistor (MOSFET) devices have gained wide acceptance in the digital electronics industry. MOSFET devices are characterized by a threshold voltage required at the gate for the transistor to turn on or off and conduct or prevent the flow of current between the source and drain. The state of the MOSFET is therefore changed with the presence or absence of a minimum threshold voltage at the gate.

Recently, manufacturers and developers of integrated circuits have sought to improve performance by lowering the power supply voltages required by the transistors. However, as power supply voltages are scaled down, MOSFET threshold voltages cannot be lowered proportionately. The lowering of the threshold voltage is limited because a minimum threshold voltage has to be maintained, e.g. 200 mV, to ensure the circuits are not sensitive to noise, and the subthreshold leakage currents are not too high. As a result, device performance gain is not as desirable in technologies with low power supply voltages due to low gate-to-source overdrive, wherein the gate-to-source overdrive is proportional to the performance of the device and is defined as the gate-to-source voltage minus the threshold voltage.

One solution that has been proposed to alleviate the low overdrive problem is the dynamic threshold voltage FET (DTFET). In such systems, the threshold voltage dynamically adjusts as the gate input voltage changes. One method in which dynamic characteristics in the DTFET are achieved is by connecting the gate directly to the body of the FET as shown in FIG. 1. In the case of an N-type DTFET (i.e., a DTNFET), when the gate is low and the DTNFET is off, the threshold voltage is high providing good noise immunity and low leakage current. When the gate switches high to turn the DTNFET on, the threshold voltage is low (near zero) due to the negative body effect, i.e., forward bias voltage from source to body. Since the threshold voltage is low during most of the switching time, the DTNFET can have very good switching speed.

Unfortunately, limitations exist with the above described system. In particular, the use of DTFETs must be limited to silicon on insulator (SOI) technologies where the FET bodies are isolated. One disadvantage of the SOI DTFET is the high substrate resistance in the device body. In general, it is difficult to make good contact (uniformly low resistance) from gate to the body substrate. A typical scheme of an SOI NFET is shown in FIG. 2. (SOI PFET is similar except for the dopant types). The gate is connected to the body at one end. Since the body substrate resistance is very high, this scheme has the disadvantage that the device width has to be very narrow. In addition, the conventional contact can only reduce body resistance in one direction because the contact can only be made at the DTFET perimeter.

In addition, there is a challenge to develop a method of manufacturing DTFETs on the substrate such that the distance between body contacts is short enough so that the apparatus can take full advantage of DT-CMOS performance benefits. This can be illustrated as follows. The less stringent constraint requires that the body is at the gate voltage at the end of a system cycle such that Tb<Tcycle, where Tb is the body RC time constant and Tcycle is the system cycle time. This less stringent constraint eliminates floating body history effects, but does not take full advantage of the DT-CMOS performance benefit. A more stringent constraint requires that the body voltage must be able to follow the gate voltage while a MOSFET switches to take full advantage of the DT-CMOS performance benefit such that Tb<Tsw, where Tsw is a typical stage delay. The body RC time constant Tb can be expressed as Tb~(Rb/Leff)× (Csj+Cdj+Cgate×Leff)×(d/2)**2, where Rb is the body sheet resistance ranging between 2~10 kohm/square, Leff is the MOSFET channel length, Csj and Cdj are the drain and source junction capacitance to the body ranging between 0.5 and 1.5 fF/$\mu$m, Cgate is the body capacitance to the MOSFET gate, and d is the distance between body contacts along the width of MOSFET gate. Cgate can be expressed as Cgate~3.5×(10 nm/Tox) fF/$\mu$m, where Tox is the MOSFET effective gate oxide thickness. For a typical 1 GHz microprocessor where Tcyc equals 1 ns and Tsw equals 10~30 ps, the MOSFETs can have Leff as 0.08 $\mu$m, Tox as 2.2 nm, Csj as 1 fF/$\mu$m, Cdj as 1 fF/$\mu$m and Rb as 6 kohm/sq. The less stringent constraint requires that d should be shorter than 4 $\mu$m to eliminate history effects in a 1 GHz processor, while the more stringent constraint requires that d should be shorter than 0.4 $\mu$m to take full advantage of DT-CMOS performance benefits.

Unfortunately, a conventional DT-CMOS gate-to-body contact adds about two lithographic minimum images to a MOSFET width to allow for alignment tolerances and adequate metal-strap contact areas. Therefore the distance between body contacts can be so large in a conventional DTFET apparatus that the apparatus cannot take full advantage of DT-CMOS performance benefits.

Therefore, without a method that allows high performance DTFETs to be implemented in SOI technologies with low gate interconnection resistance and high device packing density, the use of DTFETs will be greatly limited.

SUMMARY OF THE INVENTION

It is an advantage of the present invention to provide a method for reducing gate-to-body resistance to allow high performance of DTFET in SOI technologies.

It is a further advantage of this invention to provide a method for providing a high device packing density on a semiconductor substrate by forming a contact that uses less area than a conventional contact.

It is a further advantage of this invention to provide a method for making body contacts such that the distance between body contacts is short enough to allow a semiconductor device to take full advantage of DT-CMOS performance benefits.

It is still another advantage of this invention to reduce gate-to-body resistance in two directions of MOSFET width and to produce a contact within the gate.

The present invention generally provides a method of fabricating a FET comprising the steps of:

providing a substrate having a device area;

forming a gate on said substrate;

forming an electrically conductive contact structure from said gate to said device area, within said gate; and forming diffusion regions in said device area having a channel therebetween.

The present invention also provides a semiconductor device comprising:

a substrate;

diffusion regions in said substrate having a channel therebetween; and a gate on said substrate, wherein said gate includes a contact structure from said gate to said channel, within said gate.

The present invention further provides a semiconductor device comprising:

a substrate;

a source region and a drain region in said substrate having a channel therebetween;

a gate structure on a surface of the channel; and a contact layer within said gate electrically connected to said channel.

The present invention also provides a method of fabricating a Field Effect Transistor (FET) comprising the steps of:

providing a substrate;

forming an insulator layer over the substrate;

forming a gate on the insulator layer over the substrate;

forming openings through the gate and the insulator layer down to the substrate;

disposing conductive material in the openings in electrical contact with the substrate;

forming a conductor layer over the gate and the conductive material in the openings to electrically connect the gate to the substrate at each of the openings; and forming diffusion regions in the substrate having a channel therebetween.

BRIEF DESCRIPTION OF THE DRAWINGS

The features of the present invention will become more clearly appreciated as the disclosure of the invention is made with reference to the accompanying drawings. In the drawings:

FIGS. 4a and 4b are top views illustrating the method for forming a DTFET having a gate-to-body contact within the gate.

DETAILED DESCRIPTION OF THE INVENTION

Figure 1:
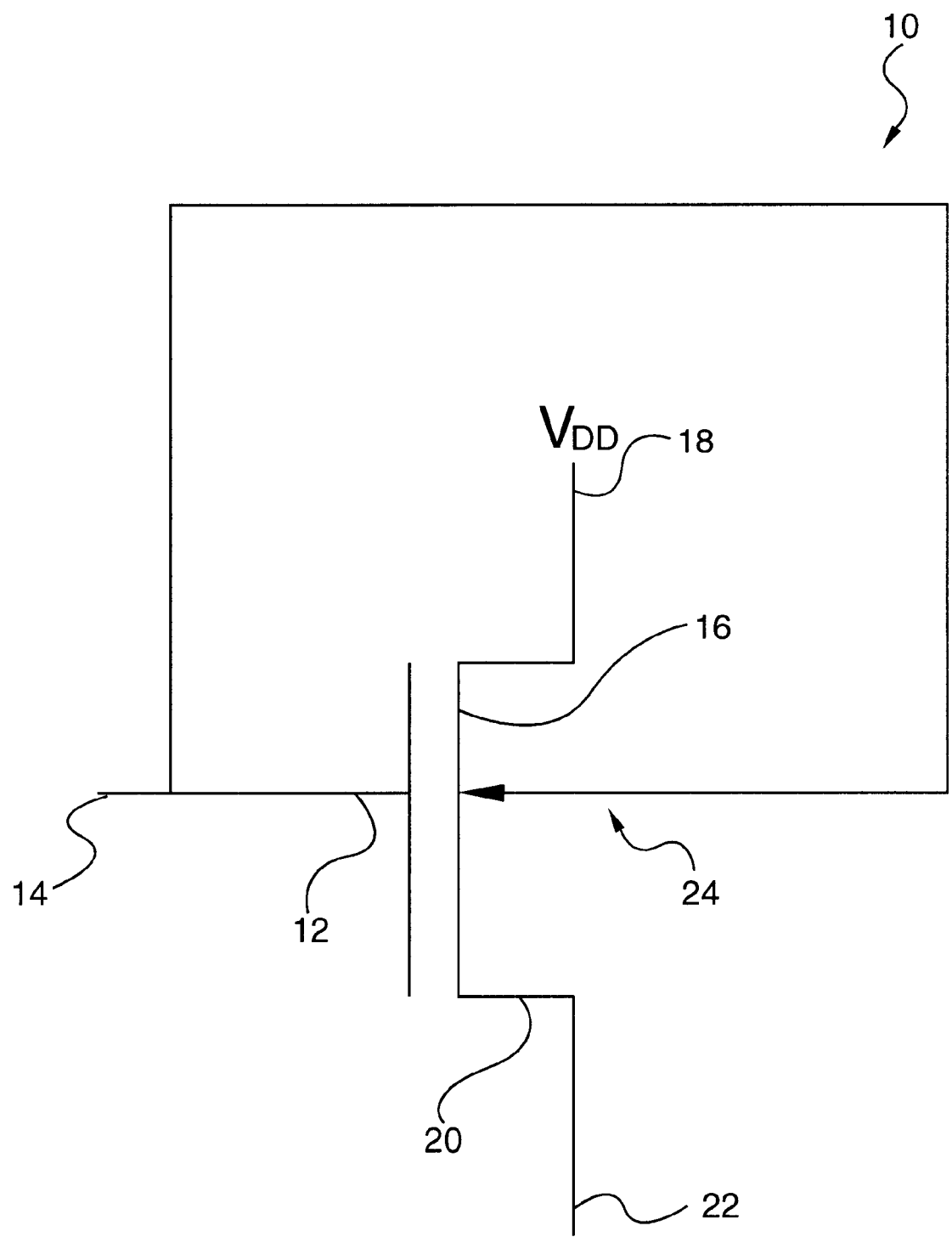
FIG. 1 depicts a transistor circuit scheme of a DTFET.

The features and advantages of the present invention are illustrated in detail in the accompanying drawings, wherein like reference numerals refer to like elements throughout the drawings. Although the drawings are intended to illustrate the present invention, the drawings are not necessarily drawn to scale.

All FFTS in FIGS. 1–9b are shown to be NFETs, however, it is understood that PFETs or combination NFET/PFET structures can easily be substituted therefore.

FIG. 1 depicts a transistor circuit scheme of a dynamic threshold field effect transistor 10 (DTFET). The DTFET 10 includes a gate 12 that is tied to an input 14, a drain 16 that is tied to a voltage supply VDD 18, a source 20 that is tied to an output 22, and a body 24.

By connecting the gate 12 the body 24, the threshold voltage can be dynamically adjusted as the input 14 changes during a switching time. In particular, when the input 14 goes high, the output 22 becomes equal to the drain voltage VDD such that the FET is turned on. Because the body 24 is connected to the input 14 and gate 12, the threshold voltage is dynamically lowered so that the FET can be turned on with a lower input voltage. Alternatively, when the input 14 is low, i.e., below the threshold voltage, the output 22 remains unchanged such that the FET is turned off. The threshold voltage remains high providing good noise immunity and low leakage current.

Figure 2:
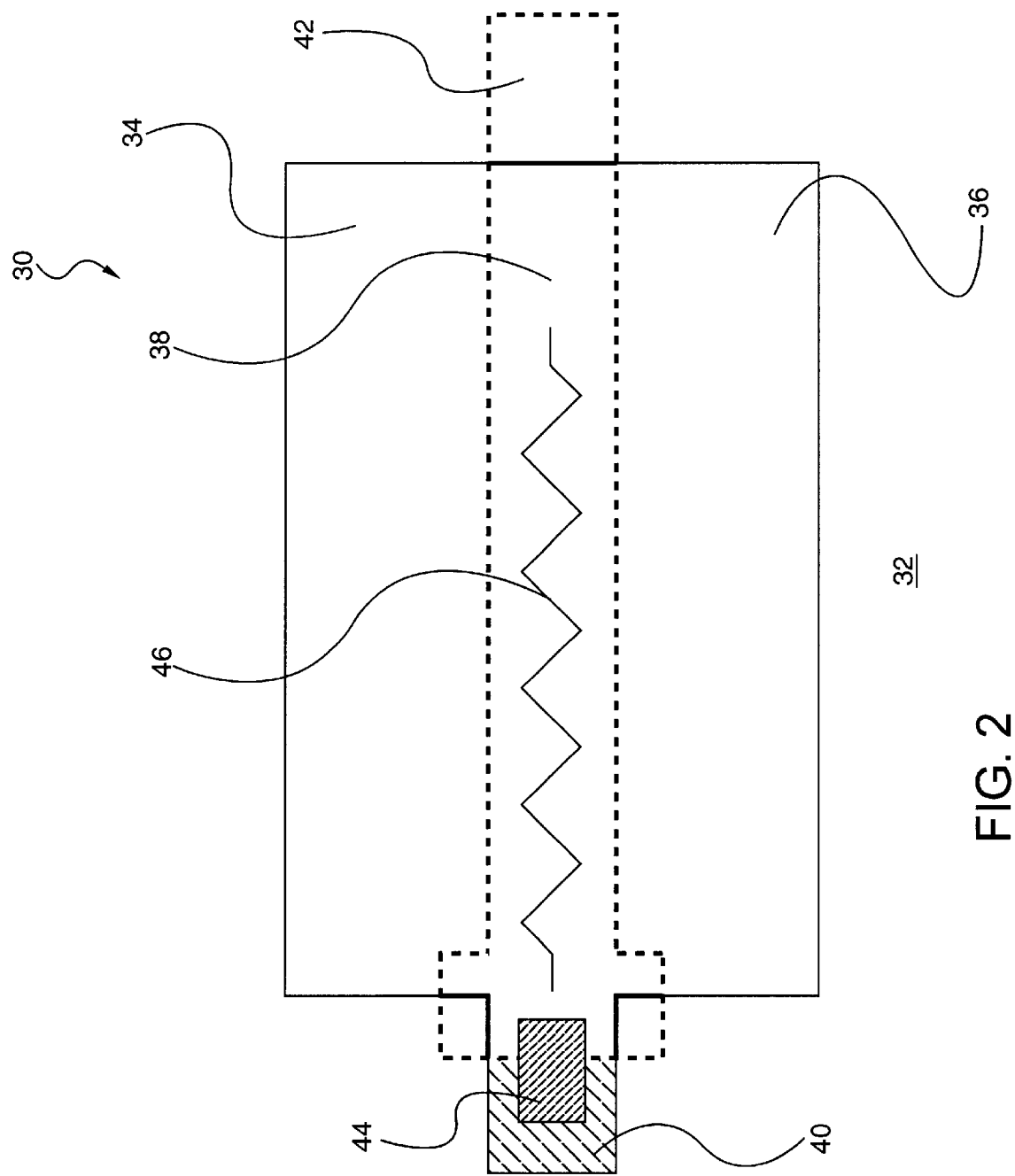
FIG. 2 illustrates a top view of a conventional body contact from a gate to one perimeter of a FET.

FIG. 2 illustrates a conventional way of forming a gate-to-body contact 40 in a conventional DTFET 30. The DTFET 30 includes a field isolation area 32, an N+ drain 34, an N+ source 36, a P– body 38, an N+ doped polysilicon gate 42 and a P+ body contact 40 that has a gate to body metal strap 44. The gate to body metal strap 44 is electronically connected to the P– body 38 so that the P+ body contact 40 is connected to the P– body 38. However, because the gate to body metal strap 44 can only be connected to the P– body 38 from the perimeter of the P– body 38, a body resistance 46 can be very high and the use of the DTFET in SOI technologies is greatly limited. Since the body resistance 46 is dependent on the width of the device, the device has to be made very narrow to lower the body resistance 46.

Figure 3:
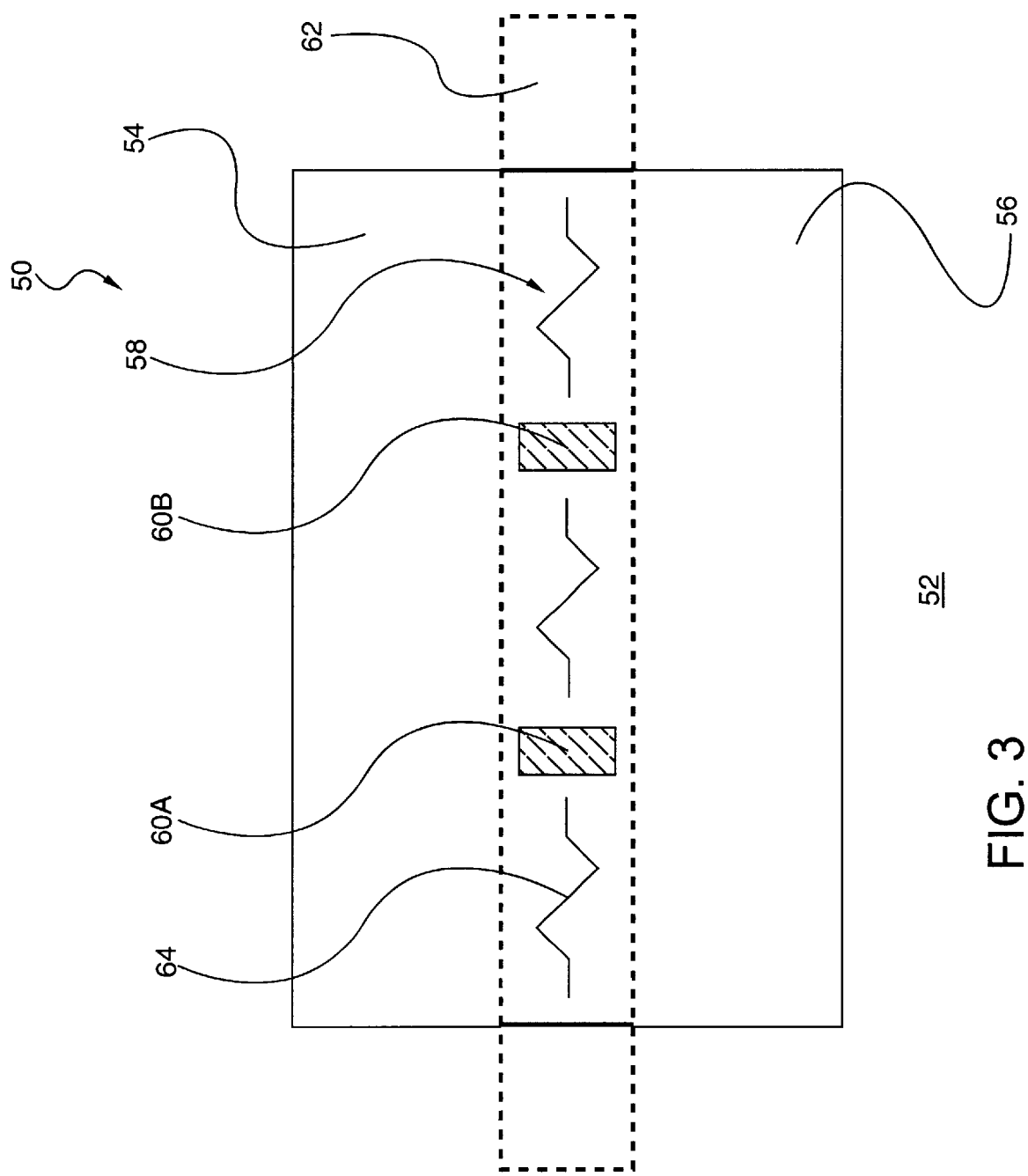
FIG. 3 illustrates a top view of a body contact from a gate to a substrate, within the gate, in accordance with the present invention.

This invention proposes a new DTFET structure that eliminates the device width constraint, as shown in FIG. 3. The DTFET structure 50 includes a field isolation area 52, an N+ drain 54, an N+ source 56, a P– body 58, an N+ doped polysilicon gate 62 and P+ body contacts 60A and 60B. The P+ body contacts 60A and 60B connect the N+ doped gate 62 to the P– body 58 within the N+ doped gate 62. The P+ body contacts 60A and 60B can extend into the P– body 58 for about several hundred Ås. Thus, the gate-to-body resistance is dependent on the polysilicon gate resistance, not the body resistance.

Figure 4B:
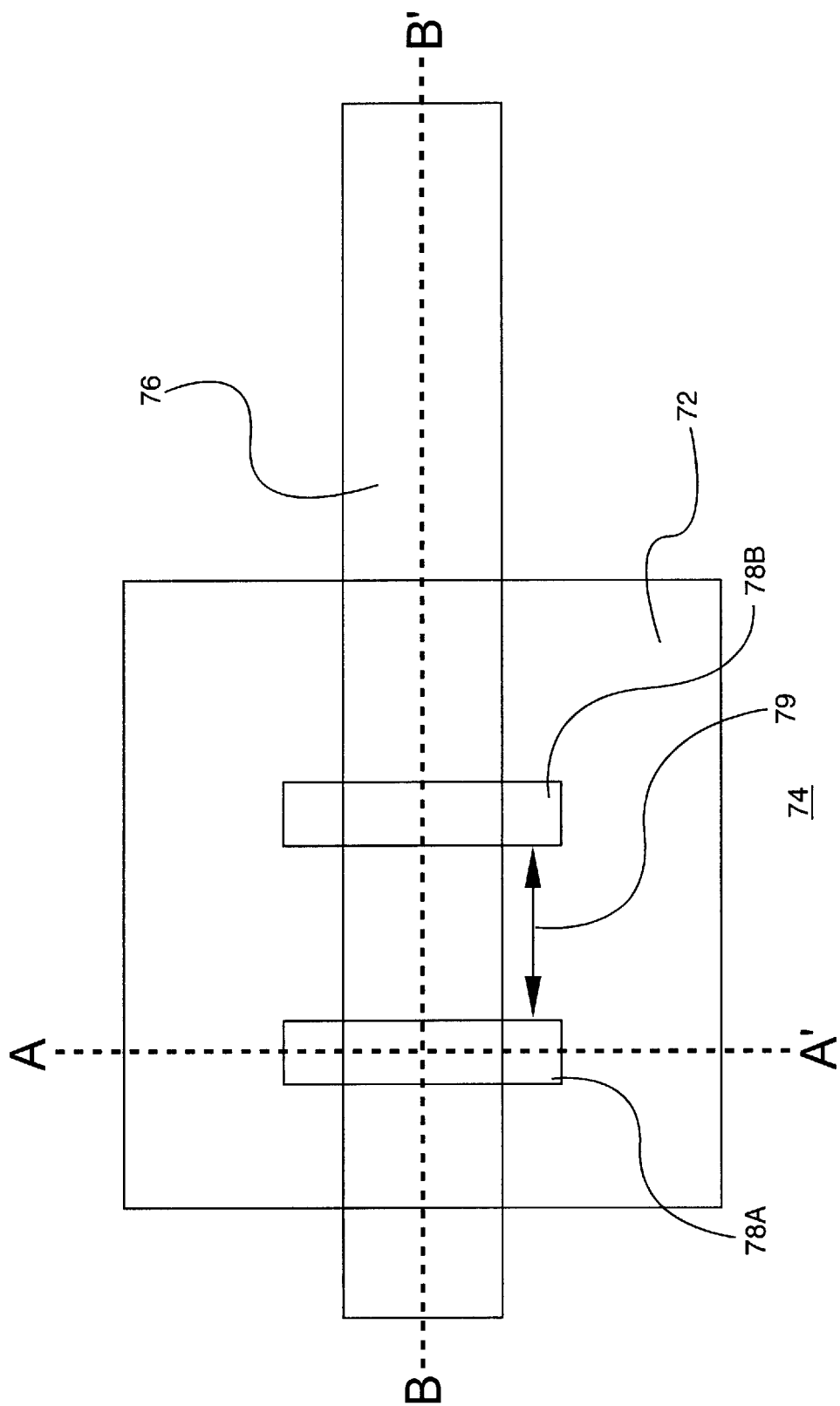

FIGS. 4a and 4b illustrates top views of fabricating a DTFET having a gate-to-body contact within the gate. A gate conductor 76 is formed along a direction B–B' on a device area 72 and a field isolation area 74. The device area 72 is surrounded by the field isolation area 74. The gate conductor 76 is typically doped polysilicon. Body contacts are formed in body contact regions 78A and 78B, and are separated by a distance 79. Additional details are illustrated in FIGS. 5a–9b.

In the following description of the present invention, FIGS. 5a, 6a, 7a, 8a, and 9a, are sequential cross-sectional views of the method for producing a DTFET according to the present invention, taken along lines A–A' of FIG. 4b. Correspondingly, FIGS. 5b, 6b, 7b, 8b, and 9b, are sequential cross-sectional views taken along lines B–B' of FIG. 4b.

Figure 5A:
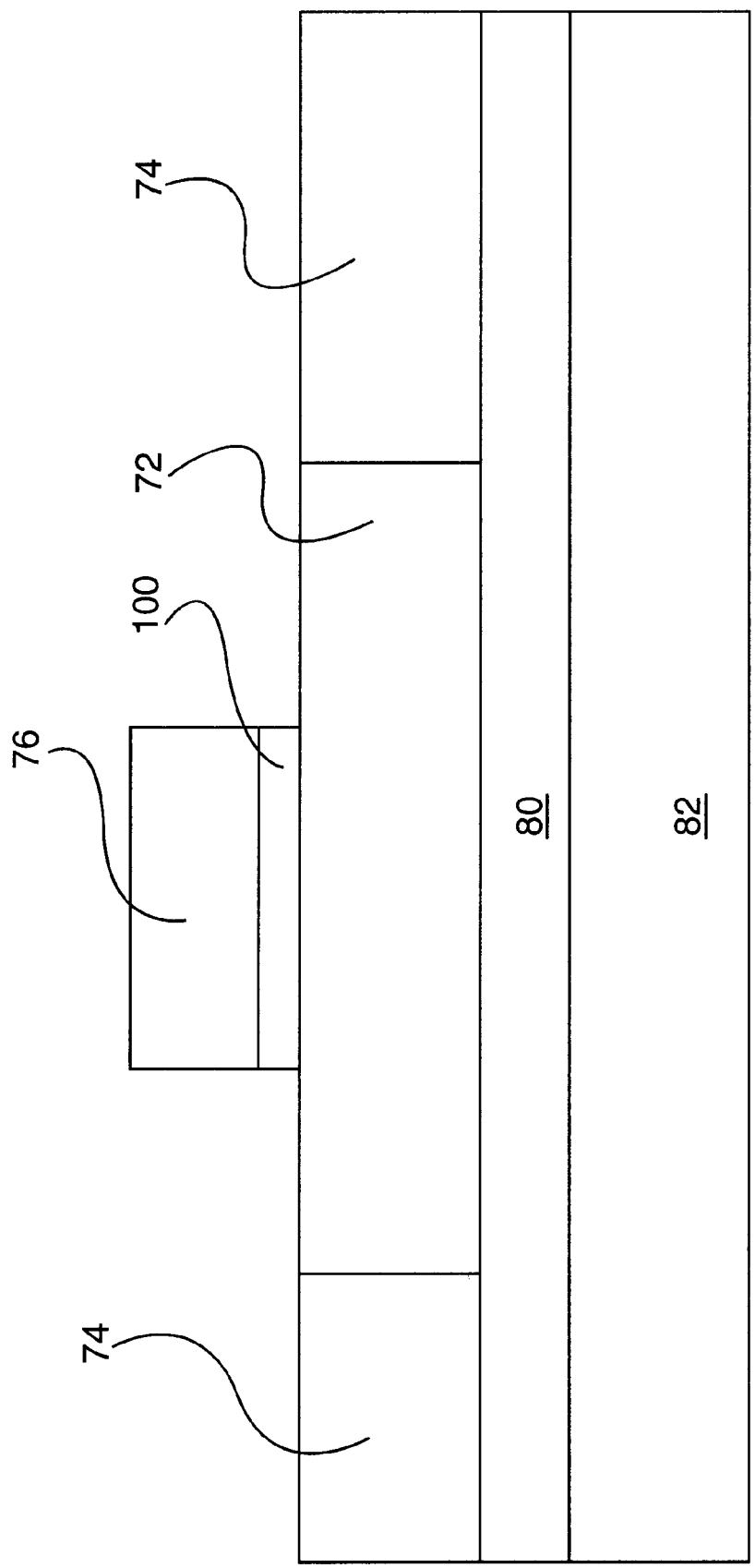
FIGS. 5a–9b are cross sectional views illustrating the method for forming a DTFET having a gate-to-body contact within the gate.
Figure 5B:
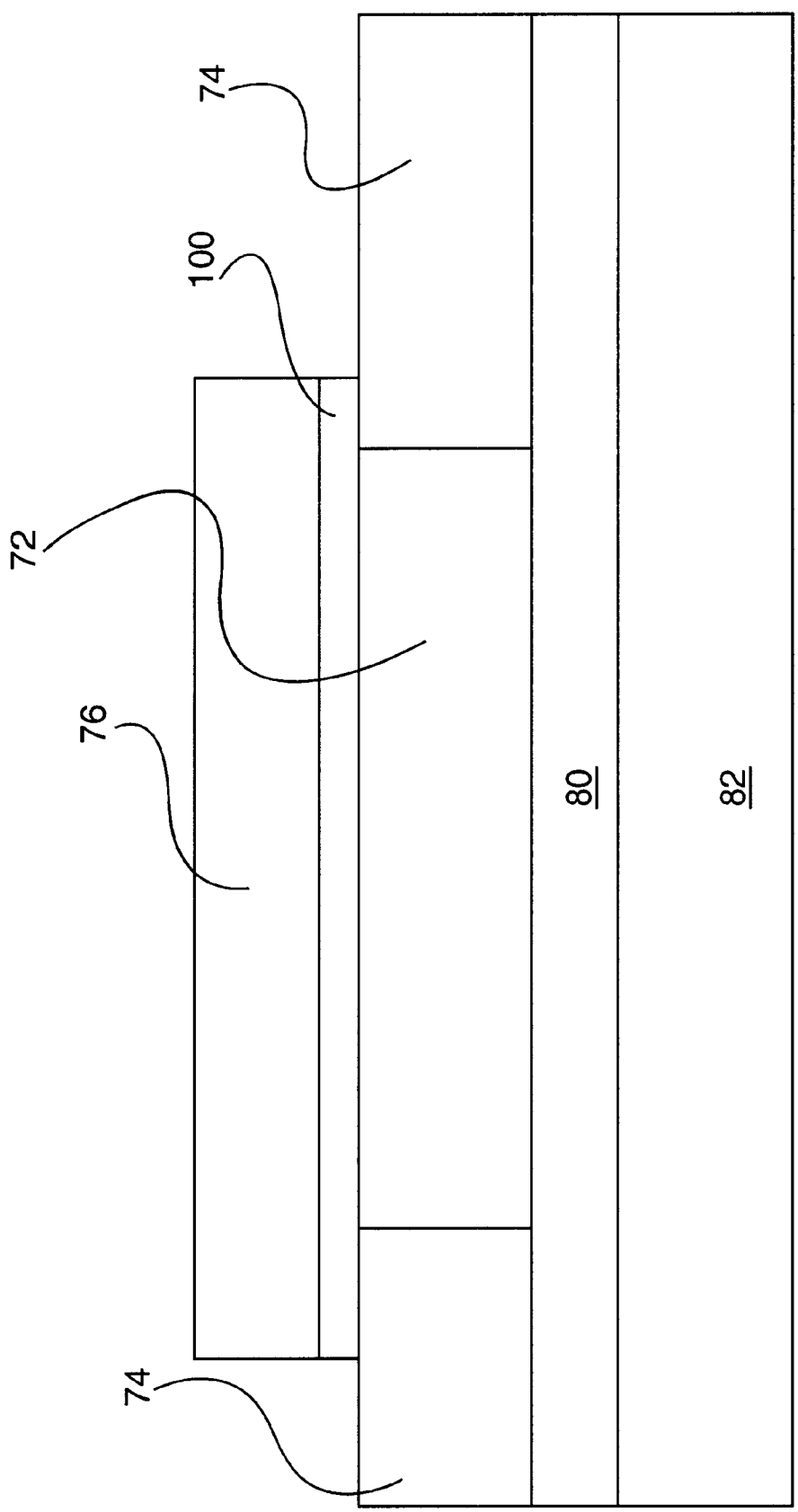

FIGS. 5a and 5b are cross sectional views illustrating the method for forming a silicon on insulator dynamic threshold field effect transistor (SOI DTFET) in accordance with the present invention. The method begins by providing an SOI substrate, including the device area 72, a buried oxide 80 and a Si-wafer 82. Field isolation areas, such as field oxide layers 74, are formed surrounding the device area 72 to electronically isolate the device area 72. On the device area 72 is grown a gate insulator 100. The gate conductor 76 is then deposited on the gate insulator 100. The gate insulator 100 can be a silicon dioxide (S$_x$O$_2$) layer. The gate conductor 76 is typically a polysilicon layer that is doped with an N+ type dopant, such as arsenic (As) either by an ion implantation or by in-situ doping during the polysilicon deposition. The thickness of the gate conductor is preferably about 100–200 nm.

Figure 6A:
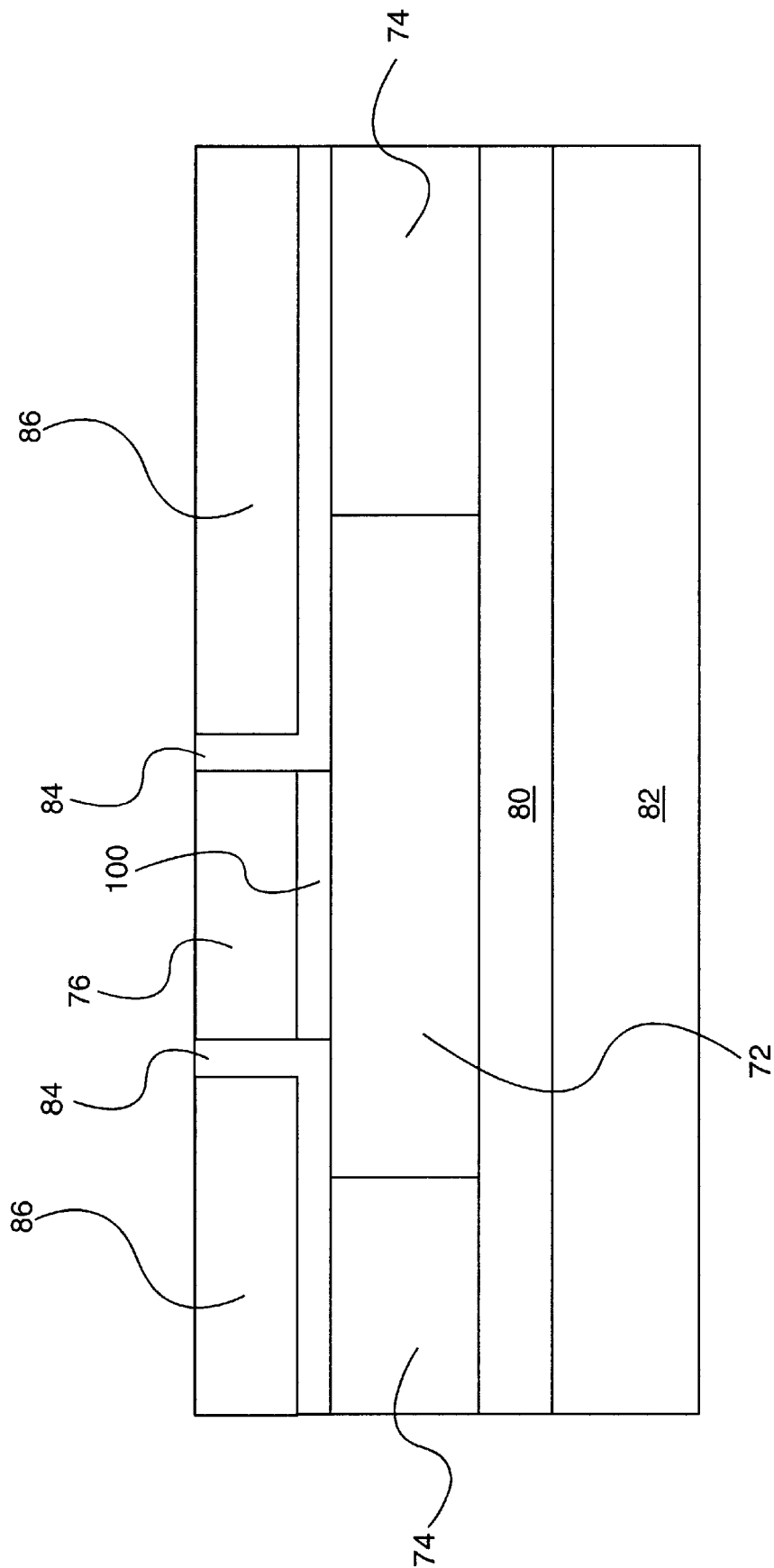
Figure 6B:
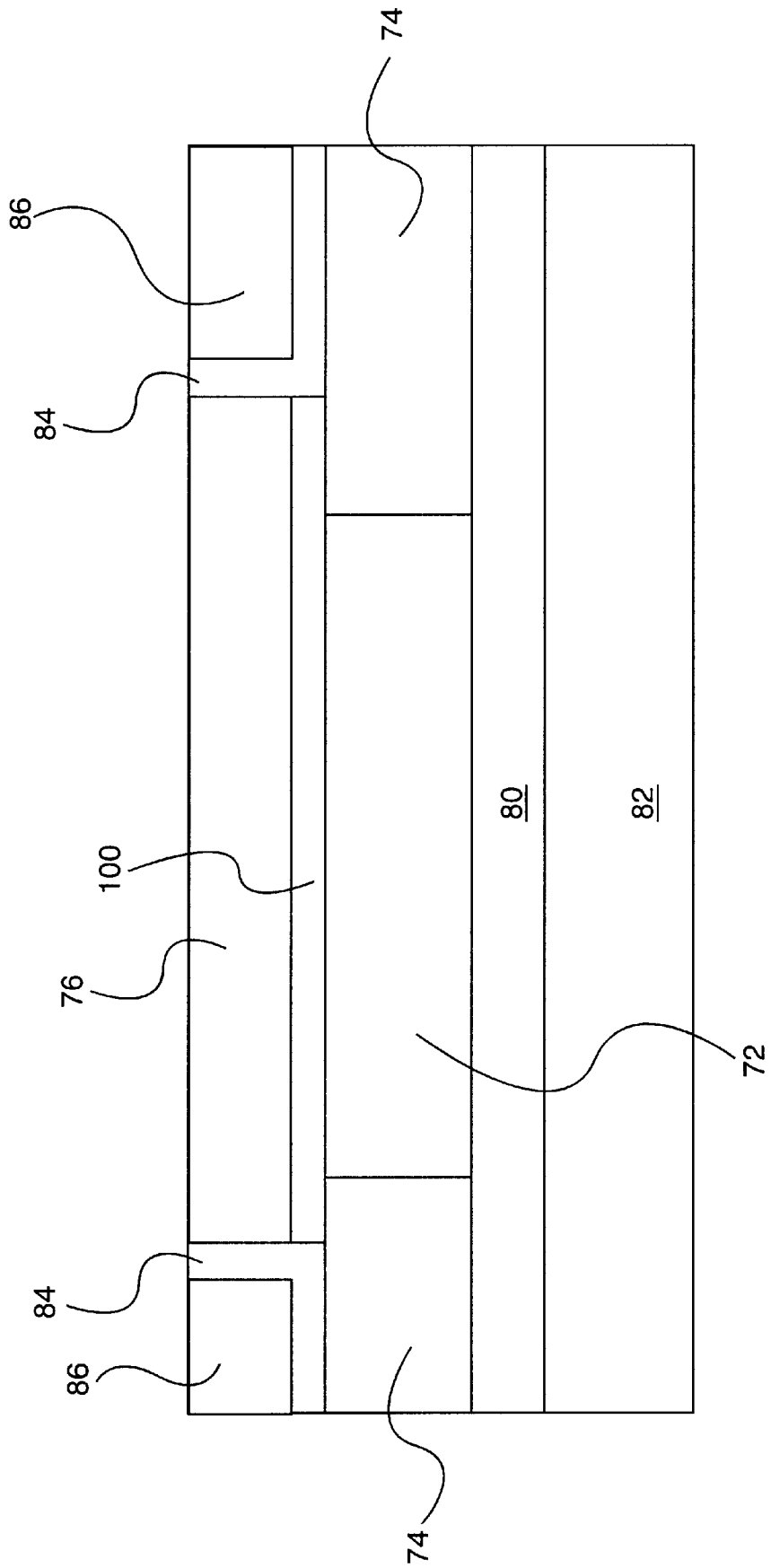

As illustrated in FIGS. 6a and 6b, a blanket insulating layer 84 is deposited on the gate conductor 76 and elsewhere on the substrate. The preferred deposition is by LPCVD using, for example, tetraethosiloxane (TEOS). The preferred thickness of the blanket insulating layer 84 is about 5–20 nm. Then, a nitride layer 86 is formed on the blanket insulating layer 84 and elsewhere on the substrate. The nitride layer 86 is thicker than the gate conductor 76, and the thickness of the nitride layer 86 is preferably about 250–300 nm. The surface of the nitride layer 86 is then polished or etched flat by a well known chemical mechanical polishing (CMP) process. During the CMP process, the thickness of the nitride layer 86 is decreased until the gate conductor 76 is reached. It is shown that the gate conductor 76 is surrounded by the nitride layer 86 and the blanket insulating layer 84.

Figure 7A:
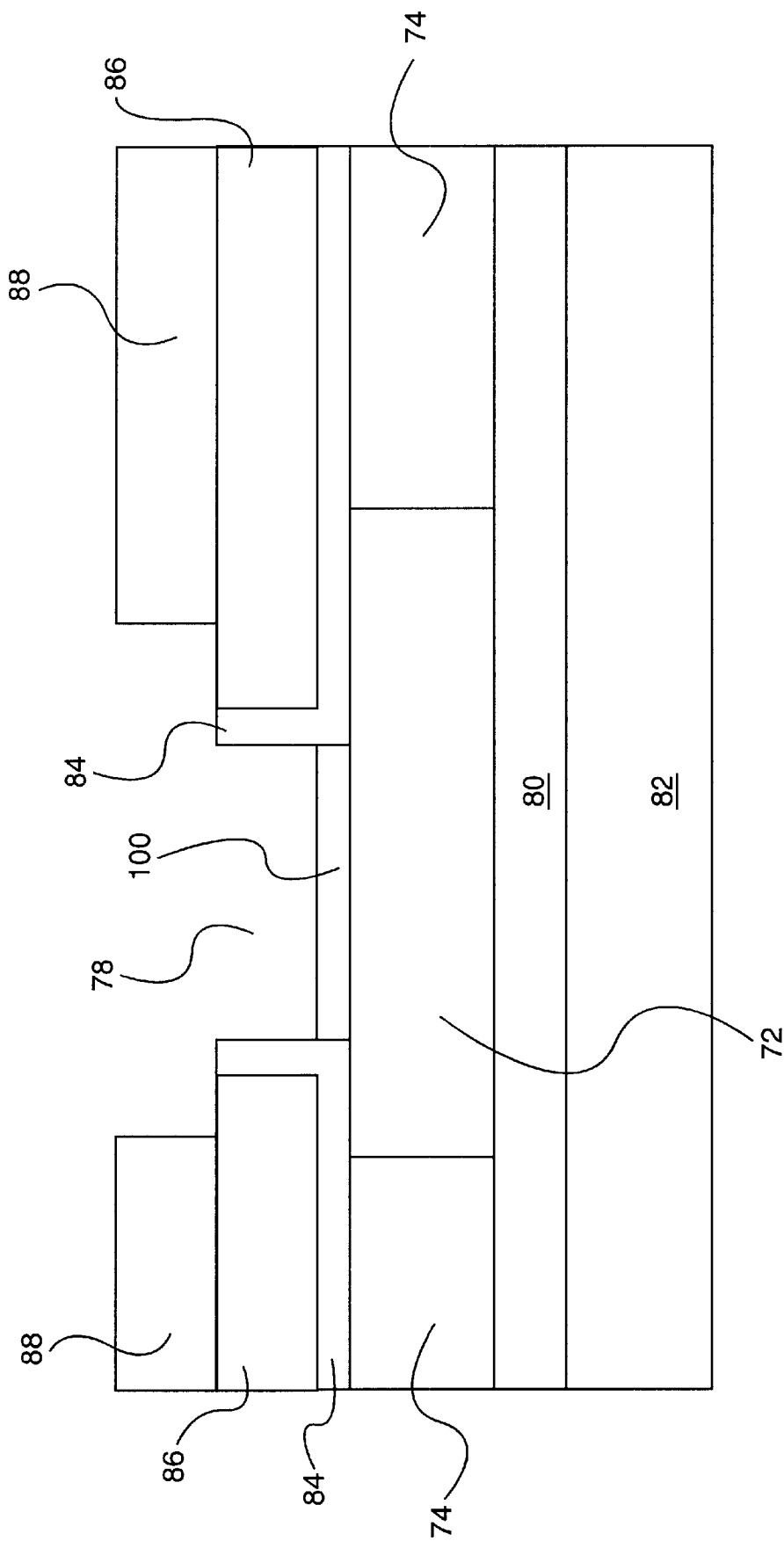
Figure 7B:
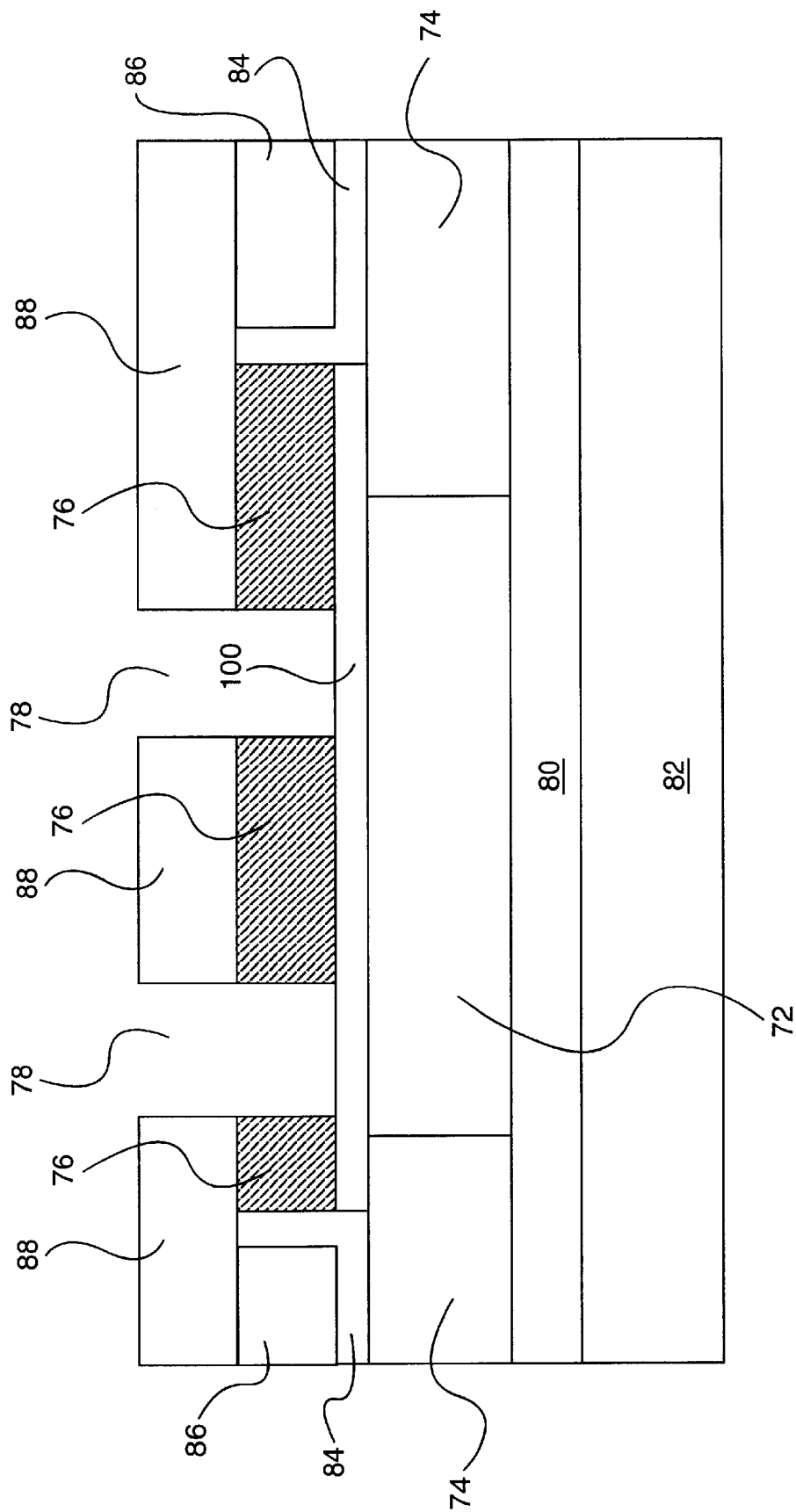

Now referring to FIGS. 7a and 7b, a damascene process is undertaken to form a contact structure within the gate conductor 76. First, a resist layer 88 is deposited to protect the area other than the body contact regions 78. The exposed body contact regions 78 are etched in a reactive ion etcher (RIE) using a suitable etch gas mixture. As shown in FIG. 7b, portions of the gate conductor 76 are etched in the body contact regions 78.

Figure 8A:
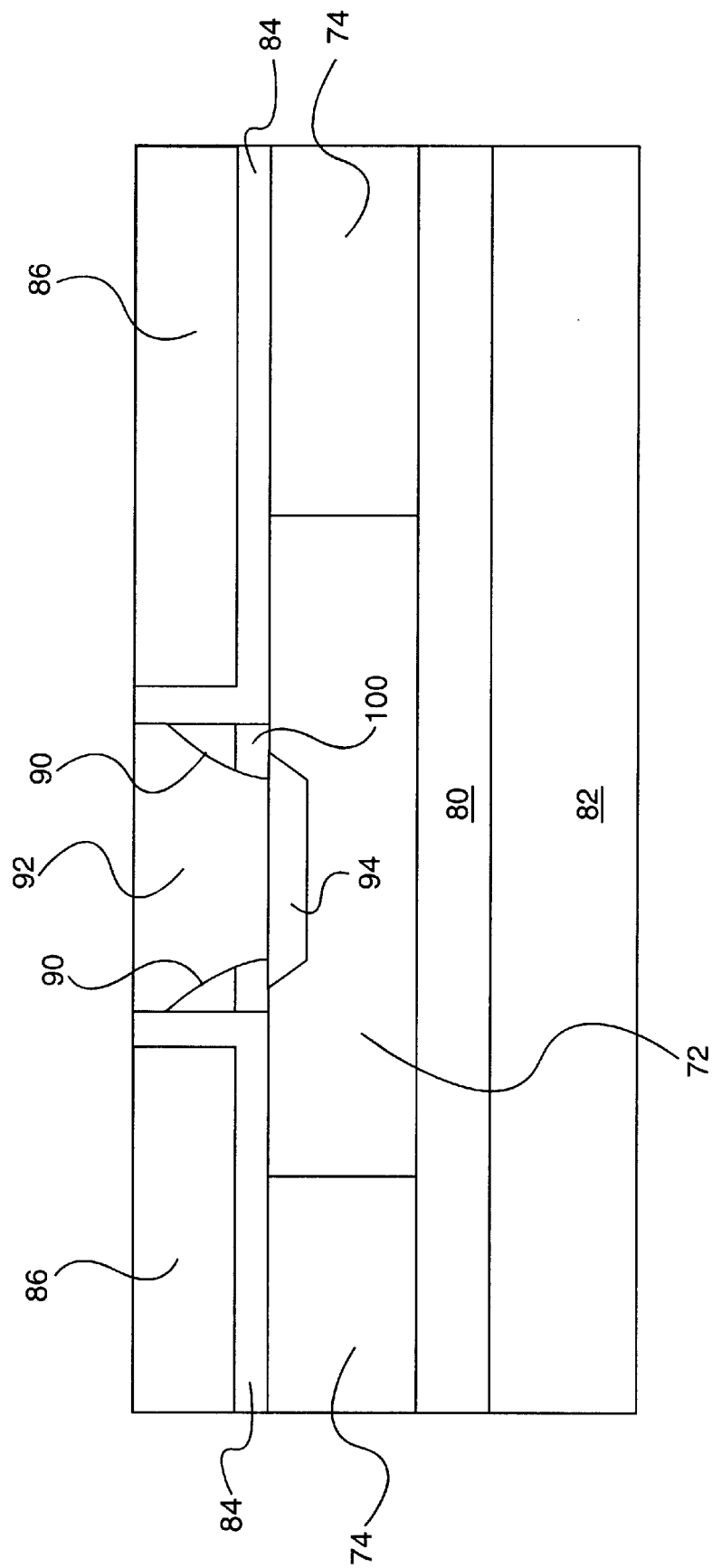
Figure 8B:
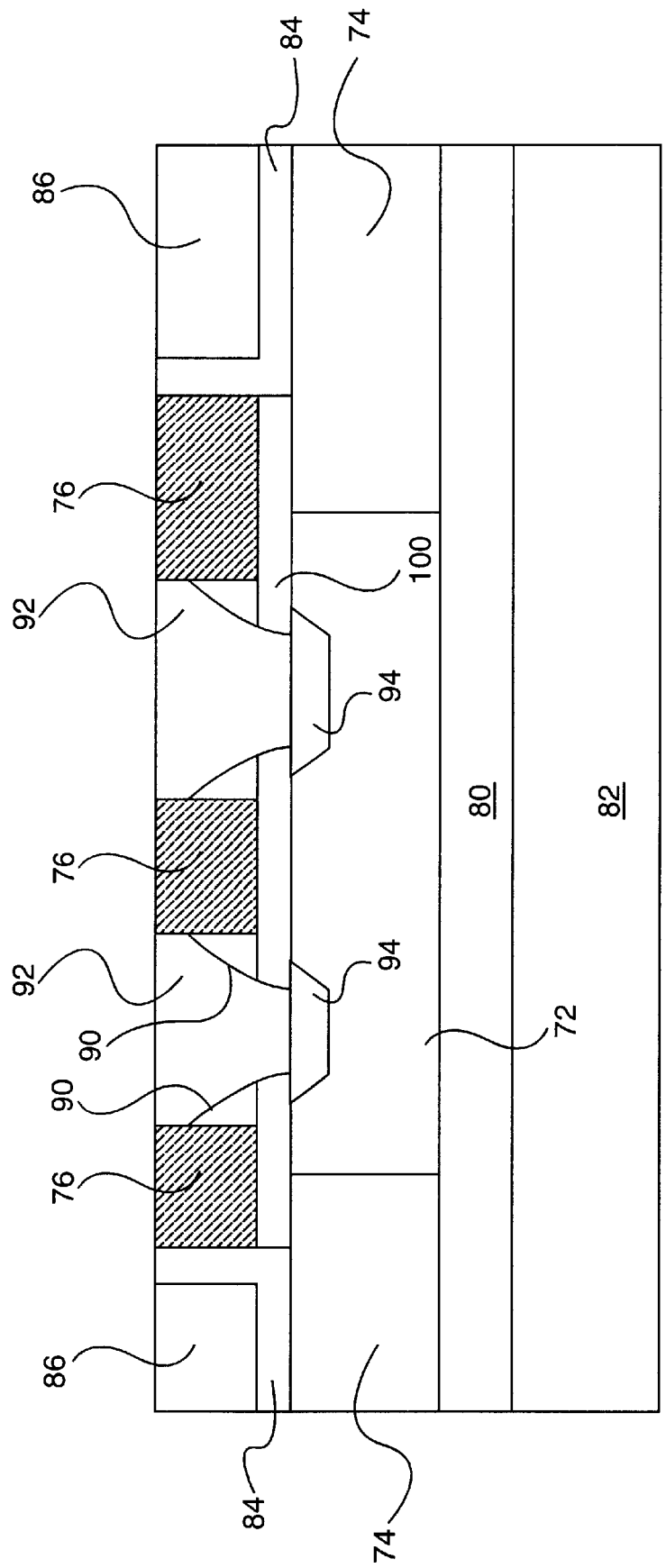

As illustrated in FIGS. 8a and 8b, the resist layer 88 is removed in a known manner. Oxide spacers 90 are formed on the sidewalls of the nitride layer 86 to prevent diffusion between body contact and source/drain junctions. The oxide spacers 90 are formed by depositing a conformal sidewall material layer preferably having a thickness of about 5–20 nm, which is then etched back. The etch back can be carried out by RIE.

Further referring to FIGS. 8a and 8b, several methods can be chosen to form a body contact structure through the gate conductor 76. One method is to deposit a contact layer 92 into the contact regions 78 that has the same doping as the device area 72. The preferred contact layer 92 is typically doped with a P+ type dopant. The thickness of the lo contact layer 92 is about 10–20 nm. The out diffusion layer 94 is formed by an out diffusion process. An alternate way is to form a low resistance contact by implanting, and then to deposit contact material (e.g. polysilicon, tungsten, etc.) into the contact regions 78. Here, a low resistance gate-to-body contact has been produced within the gate.

Still referring to FIGS. 8a and 8b, the surface of the contact layer 92 is polished or etched using a CMP process. The nitride layer 86 is removed and the blanket insulating layer 84 is exposed.

Figure 9A:
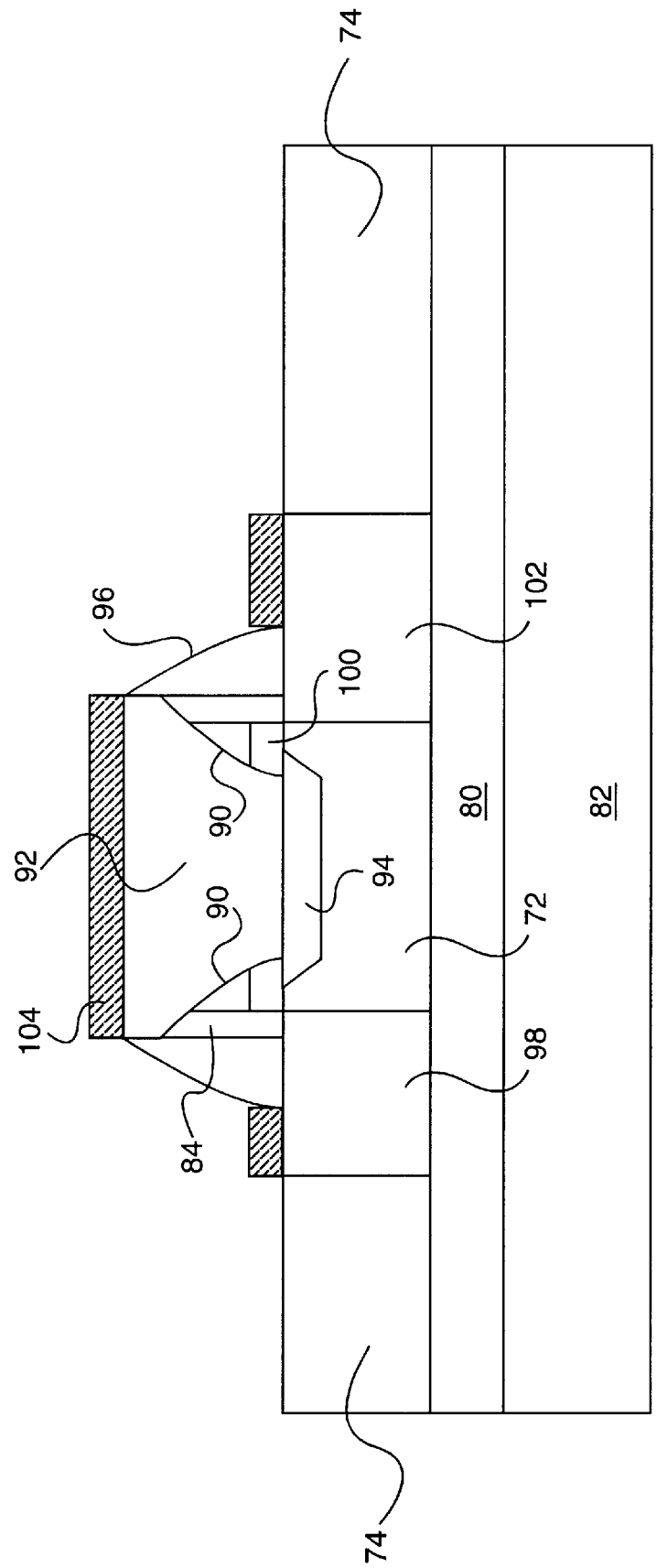
Figure 9B:
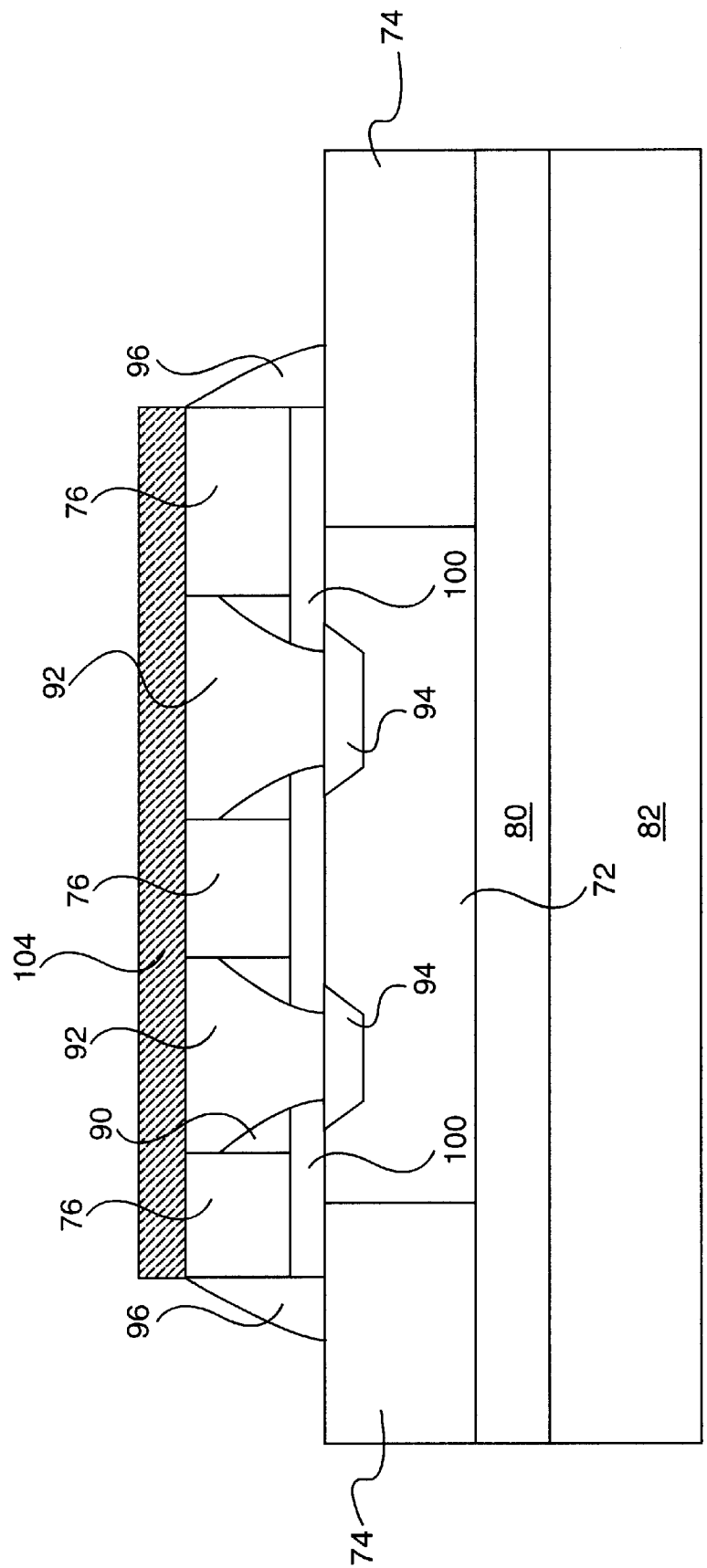

The last step of the invention is a standard MOSFET processing, as shown in FIGS. 9a and 9b. Gate sidewall spacers 96 are formed on the sidewalls of the gate conductor 76. These sidewall spacers 96 are formed by a similar method as that used to form the oxide spacers 90. After the sidewall spacers 96 are formed, an ion implantation is used to form a source area 98 and a drain area 102. Typically the heavily doped source area 98 and drain area 102 are formed by implanting a dopant such as arsenic or phosphorous. The N-channel DTFET is formed on SOI, and an extra step can be taken to improve the conductivity of the gate, source and drain by depositing a silicide layer 104.

The foregoing description of the present invention has been presented for purposes of illustration and description. It is not intended to be exhaustive or to limit the invention to the precise form disclosed, and many modifications and variations are possible in light of the above teaching. Such modifications and variations that may be apparent to a person skilled in the art are intended to be included within the scope of this invention as defined by the accompanying claims.

We claim:

1. A method of fabricating a Field Effect Transistor (FET) comprising the steps of:

providing a substrate having a device area;

forming a gate on said substrate;

forming a plurality of electrically conductive contact structures from said gate to said device area, within said gate;

forming an out diffusion region adjacent said gate; and forming diffusion regions in said device area such that the diffusion regions are separated by at least one channel, wherein said at least one channel is located between the conductive contact structures.

2. method of claim 1, wherein the step of forming said gate on said substrate further includes the steps of:

forming a gate insulator layer over said substrate; and forming a gate conductor over said gate insulator layer.

3. The method of claim 2, wherein the step of forming said gate insulator layer further includes:

forming said gate insulator layer of silicon dioxide.

4. The method of claim 2, wherein the step of forming said gate conductor further includes:

forming said gate conductor of doped polysilicon.

5. The method of claim 1, wherein the step of forming said contact structure from said gate to said device area, within said gate, further includes the steps of:

forming openings through said gate down to said device area;

forming a body contact in each of the openings; and forming a conductive layer over said gate and said body contact in said openings to electrically connect said gate to said device area at each of said openings.

6. A method of fabricating a Field Effect Transistor (FET) comprising the steps of:

providing a substrate;

forming a insulator layer over the substrate;

forming a gate on the insulator layer over the substrate;

forming openings through the gate and the insulator layer down to the substrate;

disposing conductive material in the openings in electrical contact with the substrate;

forming a conductor layer over the gate and the conducitve material in the openings to electrically connect the gate to the substrate at each of the openings;

forming an out diffusion region adjacent said gate; and forming diffusion regions in the substrate such that the diffusion regions are separated by at least one of a plurality of channels.

* * * * *